(12) United States Patent
Kaji

(10) Patent No.: US 10,103,203 B2
(45) Date of Patent: Oct. 16, 2018

(54) DISPLAY UNIT AND ELECTRONIC APPARATUS

(71) Applicant: JOLED Inc., Tokyo (JP)

(72) Inventor: Kimitomo Kaji, Tokyo (JP)

(73) Assignee: JOLED Inc., Tokyo (JP)

( * ) Notice: Subject to any disclaimer, the term of this patent is extended or adjusted under 35 U.S.C. 154(b) by 124 days.

(21) Appl. No.: 15/426,659

(22) Filed: Feb. 7, 2017

(65) Prior Publication Data

US 2017/0148855 A1    May 25, 2017

Related U.S. Application Data

(63) Continuation of application No. PCT/JP2015/065846, filed on Jun. 2, 2015.

(30) Foreign Application Priority Data

Aug. 19, 2014 (JP) .................................. 2014-166660

(51) Int. Cl.
*H01L 51/52* (2006.01)
*H01L 51/56* (2006.01)
(Continued)

(52) U.S. Cl.
CPC ........ *H01L 27/3211* (2013.01); *H01L 27/322* (2013.01); *H01L 51/5036* (2013.01);
(Continued)

(58) Field of Classification Search
CPC ............. H01L 27/3211; H01L 51/5246; H01L 51/5072; H01L 51/5036; H01L 51/5056;
(Continued)

(56) References Cited

U.S. PATENT DOCUMENTS

2006/0033429 A1* 2/2006 Fujimura ............... H05B 33/04
                                                         313/509
2008/0116795 A1* 5/2008 Tsuchiya ............... H01L 27/127
                                                         313/512
(Continued)

FOREIGN PATENT DOCUMENTS

JP    2006054111 A    2/2006
WO    2016027547 A1   2/2016

OTHER PUBLICATIONS

International Search Report dated Aug. 25, 2015 for PCT/JP2015/065846.

*Primary Examiner* — Joseph C Nicely
*Assistant Examiner* — Thai T Vuong
(74) *Attorney, Agent, or Firm* — Michael Best & Friedrich LLP

(57) ABSTRACT

A display unit includes a display region, a peripheral region, an insulating layer, a separating groove, and a sealing section. A plurality of pixels are disposed in the display region. The peripheral region is provided on outer edge side of the display region. The insulating layer extends from the display region to the peripheral region. The separating groove is provided in the peripheral region and separates the insulating layer into an inner peripheral portion and an outer peripheral portion. The sealing section is provided in the outer peripheral portion of the insulating layer and seals the display region. The separating groove has a width that is narrower as a distance is larger from an outer end of the display region to an outer end of the sealing section, and is wider as the distance is smaller.

11 Claims, 11 Drawing Sheets

(51) Int. Cl.
  *H01L 51/00* (2006.01)
  *H01L 51/50* (2006.01)
  *H01L 27/32* (2006.01)
(52) U.S. Cl.
  CPC ...... *H01L 51/5056* (2013.01); *H01L 51/5072* (2013.01); *H01L 51/5088* (2013.01); *H01L 51/5092* (2013.01); *H01L 51/5246* (2013.01); *H01L 27/3244* (2013.01)
(58) Field of Classification Search
  CPC ............... H01L 51/5092; H01L 27/322; H01L 51/5088; H01L 27/3244
  USPC .......................................................... 257/40
  See application file for complete search history.

(56) References Cited

U.S. PATENT DOCUMENTS

| | | | | |
|---|---|---|---|---|
| 2008/0259549 | A1* | 10/2008 | Sumita | H01L 27/3276 361/679.02 |
| 2009/0002283 | A1* | 1/2009 | Park | H01L 27/3276 345/76 |
| 2009/0058293 | A1* | 3/2009 | Maeda | H01L 27/3276 313/512 |
| 2010/0320909 | A1* | 12/2010 | Izumi | H01L 27/3246 315/51 |
| 2011/0114936 | A1* | 5/2011 | Akimoto | H01L 27/124 257/40 |
| 2012/0273127 | A1* | 11/2012 | Kim | H01L 51/56 156/305 |
| 2013/0011942 | A1* | 1/2013 | Sakata | H01L 51/5088 438/22 |
| 2013/0153141 | A1* | 6/2013 | Lee | H01J 9/261 156/273.3 |
| 2014/0291629 | A1* | 10/2014 | Kim | H01L 27/3274 257/40 |
| 2014/0291641 | A1* | 10/2014 | Negishi | H01L 51/5253 257/40 |
| 2015/0279912 | A1* | 10/2015 | Negishi | H01L 27/3246 257/40 |

* cited by examiner

DISPLAY UNIT AND ELECTRONIC APPARATUS

CROSS REFERENCE TO RELATED APPLICATIONS

This is a continuation of International Application No. PCT/JP2015/065846, filed Jun. 2, 2015, which claims the benefit of Japanese Priority Patent Application JP2014-166660, filed Aug. 19, 2014 the entire contents of which are incorporated herein by reference.

BACKGROUND

The disclosure relates to a display unit that emits light utilizing, for example, an organic electro luminescence (EL) phenomenon, and an electronic apparatus including the display unit.

Display units such as televisions have recently been requested to have a narrower so-called bezel portion around a display region, in association with improvement in efficiency of mass production of the display panel and in search of design of the display panel. However, it is highly possible that narrowing the bezel portion may cause entry of foreign matters such as moisture from the outside to reach the display region. Particularly in an organic EL display unit using an organic EL device as a display device, the entry of the foreign matters such as moisture deteriorates the organic EL device, which brings a corresponding pixel into a non-emission state. In order to avoid the non-emission state of the pixel, various improvement methods have been made.

For example, Japanese Unexamined Patent Application Publication No. 2006-054111 discloses a display unit that prevents foreign matters such as moisture from entering the display region from the outside by providing a separating groove that separates an organic insulating film covering an entire surface of a support substrate into an inner peripheral portion and an outer peripheral portion at a position surrounding the display region.

SUMMARY

However, only by providing a separating groove around a display region, it is not possible to sufficiently prevent entry of foreign matters such as moisture from the outside. In order to further prevent the foreign matters such as moisture from entering the display region, it may be contemplated to increase a distance from an outer edge of a display panel (e.g., an outer edge of a seal) to the display region. However, the increase in the distance from the outer edge of the display panel to the display region have resulted in a wider bezel portion.

It is desirable to provide a display unit that allows for improvement in reliability while achieving a narrower bezel, and an electronic apparatus including the display unit.

A display unit according to an embodiment of the disclosure includes a display region, a peripheral region, an insulating layer, a separating groove, and a sealing section. A plurality of pixels are disposed in the display region. The peripheral region is provided on outer edge side of the display region. The insulating layer extends from the display region to the peripheral region. The separating groove is provided in the peripheral region and separates the insulating layer into an inner peripheral portion and an outer peripheral portion. The sealing section is provided in the outer peripheral portion of the insulating layer and seals the display region. The separating groove has a width that is narrower as a distance is larger from an outer end of the display region to an outer end of the sealing section, and is wider as the distance is smaller.

An electronic apparatus according to an embodiment of the disclosure includes the display unit according to an embodiment of the disclosure. The display unit includes a display region, a peripheral region, an insulating layer, a separating groove, and a sealing section. A plurality of pixels are disposed in the display region. The peripheral region is provided on outer edge side of the display region. The insulating layer extends from the display region to the peripheral region. The separating groove is provided in the peripheral region and separates the insulating layer into an inner peripheral portion and an outer peripheral portion. The sealing section is provided in the outer peripheral portion of the insulating layer and seals the display region. The separating groove has a width that is narrower as a distance is larger from an outer end of the display region to an outer end of the sealing section, and is wider as the distance is smaller.

DETAILED DESCRIPTION

Some example embodiments of the disclosure are described below in detail, in the following order, with reference to the accompanying drawings.

1. First Embodiment (An example in which a peripheral region is provided with a separating groove having a width that is varied depending on a distance from an outer end of a sealing section to an outer end of a display region)
   1-1. Overall Configuration
   1-2. Functions and Effects
2. Second Embodiment (An example in which a shielding structure is further provided between the separating groove and the display region)
3. Application Example (An application example to an electronic apparatus)

1. First Embodiment

1-1. Overall Configuration

Figure 1:
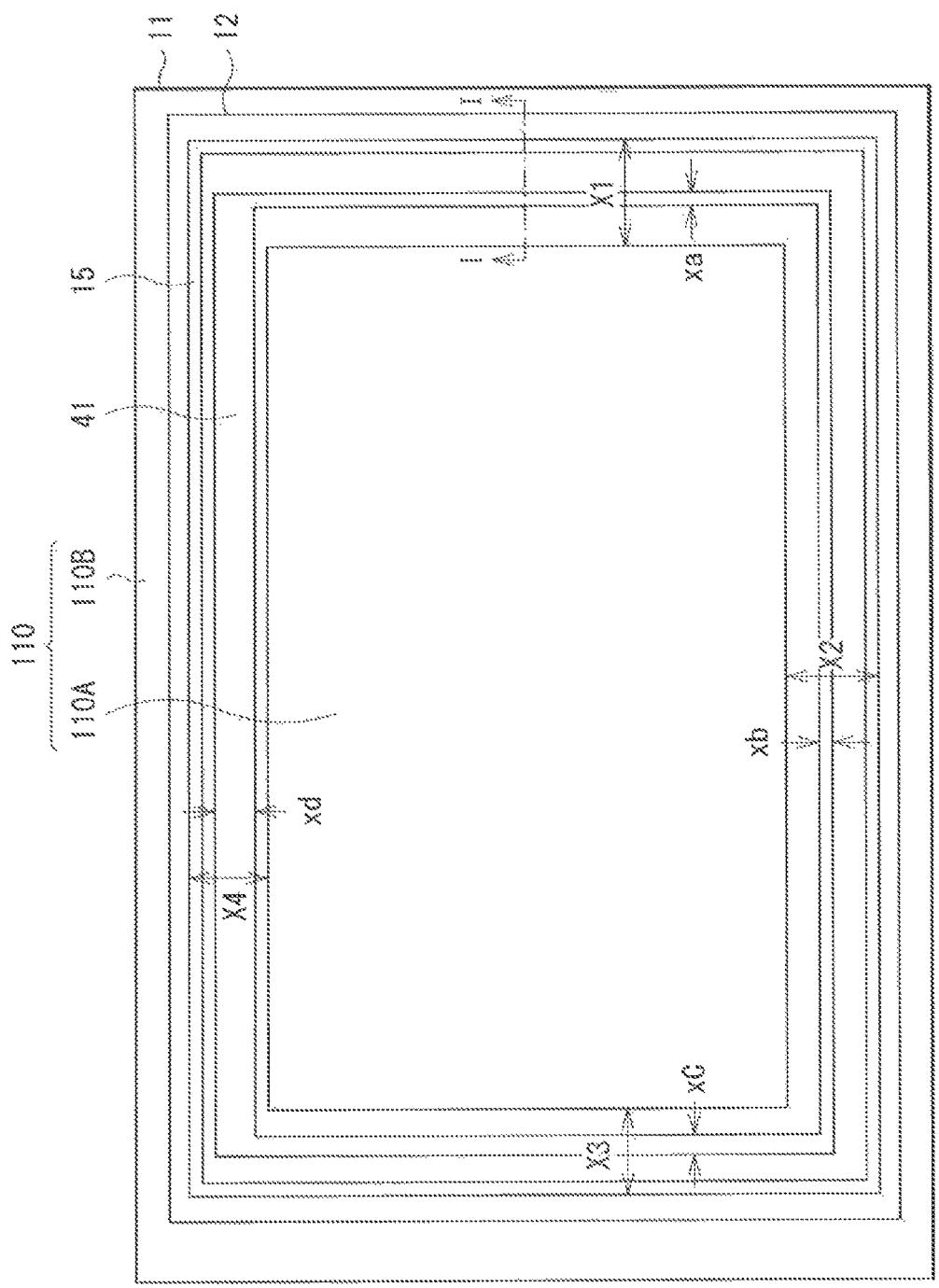
FIG. 1 is schematic diagram of a planar configuration of a display unit according to a first embodiment of the disclosure.
Figure 2:
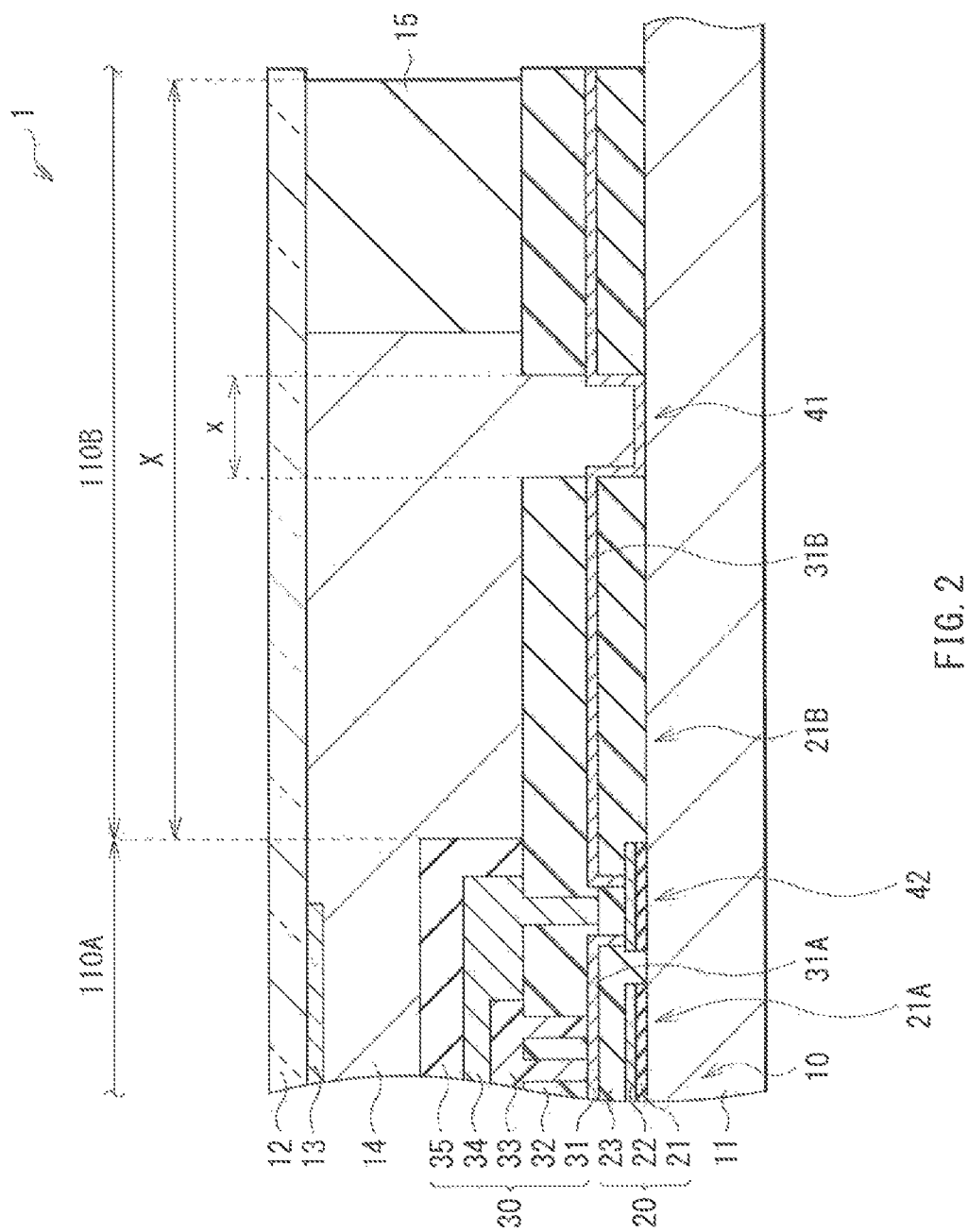
FIG. 2 is a cross-sectional view of the display unit illustrated in FIG. 1.
Figure 5:
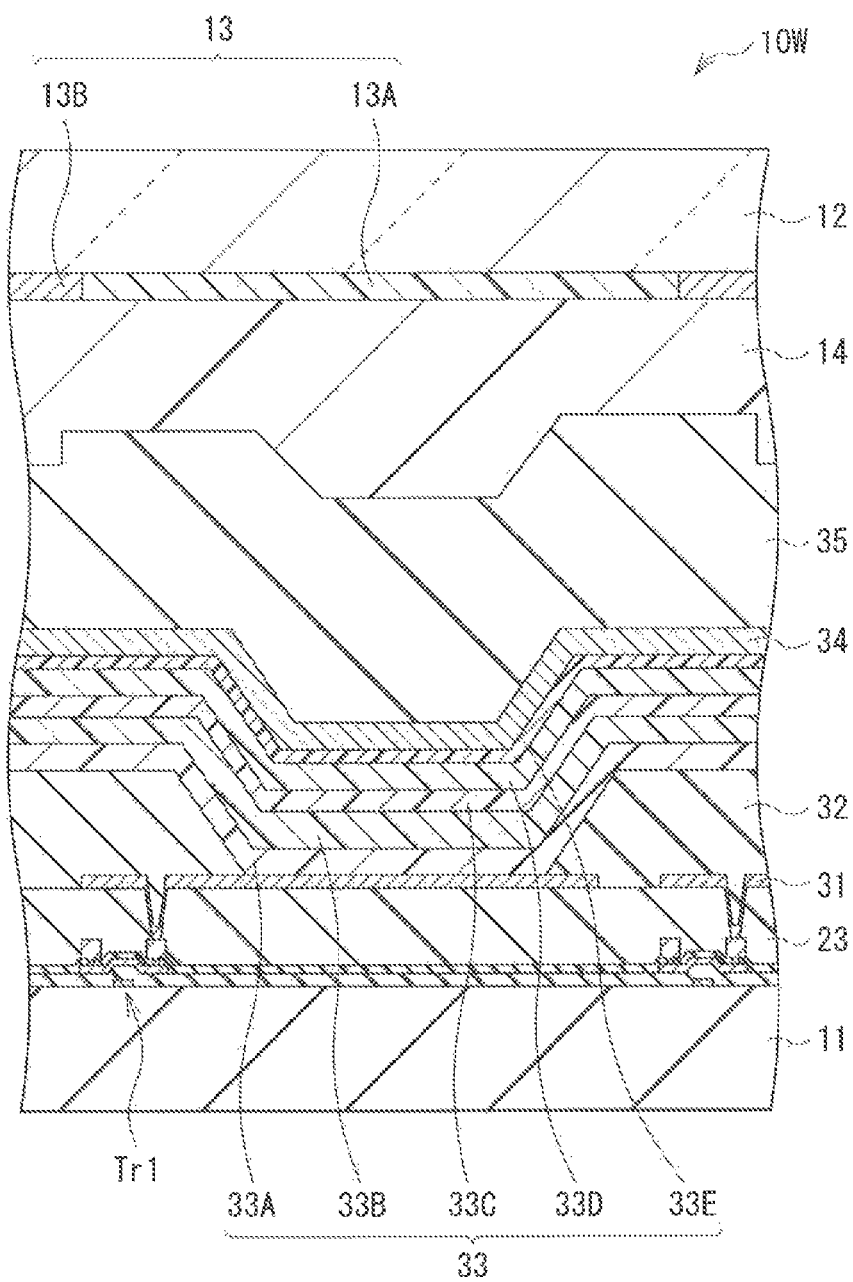
FIG. 5 is a cross-sectional view of an organic EL device that forms the display unit illustrated in FIG. 1.

FIG. 1 illustrates a planar configuration of a display unit (a display unit 1) according to a first embodiment of the disclosure. FIG. 2 illustrates a cross-sectional configuration of the display unit 1 taken along line I-I illustrated in FIG. 1. The display unit 1 may be used as an organic EL television or other apparatuses. A display region 110A and a peripheral region 110B around the display region 110A may be provided as a display panel 110 on a drive substrate 11. The display unit 1 may be a top surface light-emitting display unit (so-called top emission display unit) that emits color light beams of R (red), G (green), and B (blue) from the top surface side (a surface opposite to the drive substrate 11) by using, as display devices, for example, a white organic EL device 10W and a color filter 13A described later, as illustrated in FIG. 5. The display unit 1 according to the present embodiment has a separating groove 41 that separates insulating layers into an inner peripheral portion and an outer peripheral portion at the peripheral region 110B. The insulating layers (in this example, insulating layers 23 and 32) are formed continuously from the display region 110A to the peripheral region 110B. The separating groove 41 has a width (x) which differs depending on a distance (X) from an outer end of a sealing section 15 to an outer end of the display region 110A.

Figure 3:
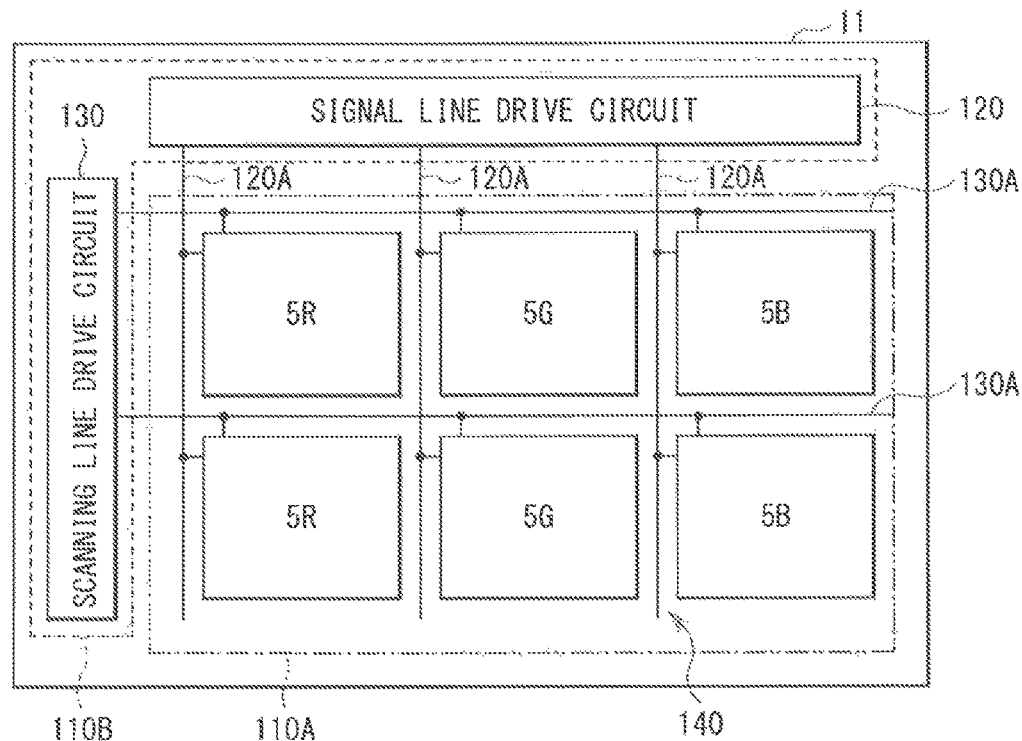
FIG. 3 illustrates an overall configuration of the display unit illustrated in FIG. 1.

FIG. 3 illustrates an example of an overall configuration of the display unit 1 illustrated in FIGS. 1 and 2. In the display region 110A, a plurality of pixels 5 (red pixels 5R, green pixels 5G, and blue pixels 5B) are disposed in matrix. Further, a signal line drive circuit 120 and a scanning line drive circuit 130 which constitute a driver (a peripheral circuit 21B described later) for displaying an image may be provided in the peripheral region 110B located on the periphery (on the outer edge side or on the outer peripheral side) of the display region 110A.

Figure 4:
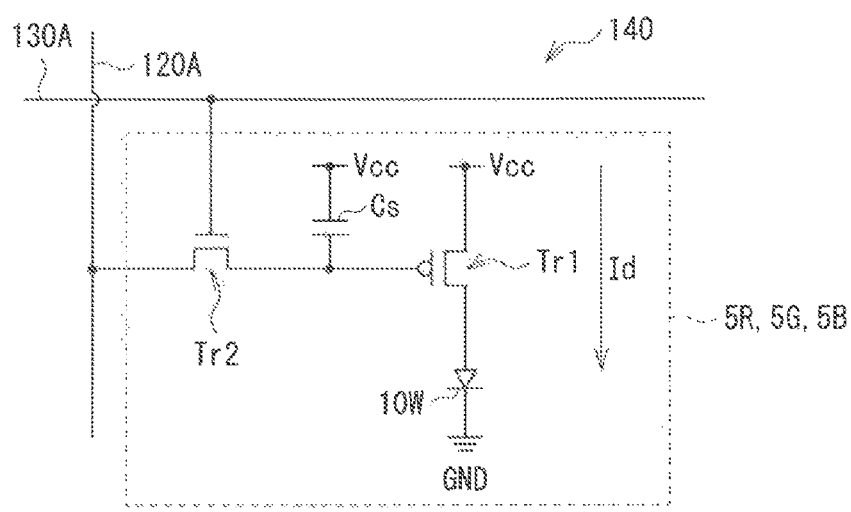
FIG. 4 illustrates an example of a pixel drive circuit illustrated in FIG. 3.

A pixel drive circuit 140 may be provided in the display region 110A. FIG. 4 illustrates an example of the pixel drive circuit 140 (an example of a pixel circuit of each of the red pixel 5R, the green pixel 5G, and the blue pixel 5B). The pixel drive circuit 140 may be an active drive circuit provided as a lower layer of a lower electrode 31A described later. The pixel drive circuit 140 may include drive transistor Tr1, a write transistor Tr2, and a capacitor (holding capacitor) Cs provided between the transistors Tr1 and Tr2. The pixel drive circuit 140 may also include the white organic EL device 10W coupled in series to the drive transistor Tr1 between a first power supply line (Vcc) and a second power supply line (GND). In other words, the white organic EL device 10W may be provided in each of the red pixel 5R, the green pixel 5G, and the blue pixel 5B. The drive transistor Tr1 and the write transistor Tr2 may be each configured by a typical thin film transistor (TFT). The configuration of each of the drive transistor Tr1 and the write transistor Tr2 is not particularly limited, and either may be, for example, an inverted staggered structure (so-called a bottom gate structure), or may be a staggered structure (a top gate structure).

The pixel drive circuit 140 may include a plurality of signal lines 120A in a column direction, and a plurality of scanning lines 130A in a row direction. A point of intersection between each of the signal lines 120A and each of the scanning lines 130A may correspond to any of the red pixel 5R, the green pixel 5G and the blue pixel 5B. Each of the signal lines 120A may be coupled to the signal line drive circuit 120. An image signal may be supplied from the signal line drive circuit 120 to a source electrode of the write transistor Tr2 through the signal line 120A. Each of the scanning lines 130A may be coupled to the scanning line drive circuit 130. A scanning signal may be supplied sequentially from the scanning line drive circuit 130 to a gate electrode of the write transistor Tr2 through the scanning line 130A.

As described above, the peripheral region 110B may have the separating groove 41 that separates each of the insulating layers 23 and 32 that cover the display panel 110 into the inner peripheral portion and the outer peripheral portion. The separating groove 41 may be provided for reducing entry of foreign matters such as moisture into the display panel 110, more specifically, into the display region 110A from the outside.

In the present embodiment, the separating groove 41 may be so set as to have the width (x) which differs depending on the distance (X) from the outer end of the sealing section 15 to the outer end of the display region 110A, as described above. More specifically, as illustrated in FIG. 1, the distance (X) from the outer end of the sealing section 15 to the outer end of the display region 110A in an any position (in this example, at each side) of the display panel 110 may be set as X1, X2, X3, and X4; the width (x) of the separating groove 41 corresponding to each of the sides may be set as xa, xb, xc, and xd. When size of the distance (X) is defined as X1>X2>X3>X4, for example, size of the width (x) of the separating groove 41 may satisfy the expression: xa<xb<xc<xd. This makes it possible to reduce the entry of foreign matters into the display region 110A to the same degree as the case where the distance (X) is larger, even when the distance (X) from the outer end of the sealing section 15 to the outer end of the display region 110A is smaller. In other words, it becomes possible to adjust the rate of the foreign matters reaching the display region 110A regardless of the size of the distance (X).

The separating groove 41 may be preferably filled with a material having a water permeability lower than that of a material forming the insulating layers 23 and 32. By filling the inside of the separating groove 41 with the material having the lower water permeability, it becomes possible to further lower the rate of the foreign matters entering the display region 110A from the outside. The material that fills the separating groove 41 may be preferably an inorganic material, for example. In the present embodiment, the separating groove 41 may be filled with a material that forms a filling layer 14 described later.

Description is now given of each of sections that constitute the display unit 1 with reference to FIGS. 2 and 5.

The display unit 1 may have a layered structure in which a TFT layer 20, a display layer 30, the filling layer (adhesive layer) 14, and the sealing section 15 are provided in this order on the drive substrate 11. The TFT layer 20 may be configured, for example, by an insulating layer 21, a wiring layer 22, and an insulating layer 23. The insulating layer 21 may be configured by a pixel drive circuit 21A (corresponding to the pixel drive circuit 140) and the peripheral circuit 21B, for example. The display layer 30 may be configured, for example, by a wiring layer 31, an insulating layer 32, an organic layer 33, an upper electrode 34, and a protective layer 35. The wiring layer 31 may be configured by the lower electrode 31A, for example. A counter substrate 12 provided with a CF layer 13 may be adhered onto the layered structure, and may be so disposed as to seal the layered structure together with the sealing section 15. The CF layer 13 may be configured by a color filter 13A and a black matrix (a light-shielding film) 13B. It is to be noted that the order in which the filling layer 14 and the sealing layer 15 are provided may be reversed.

The drive substrate 11 may be a support having a main surface on which the white organic EL devices 10W are arranged and provided. Quartz, glass, metal foil, or a film or sheet made of resin, for example, may be used as the drive substrate 11.

The insulating layer 21 (pixel drive circuit 21A and peripheral circuit 21B) may be a drive circuit (a driver that displays an image) configured by the signal line drive circuit 120 and the scanning line drive circuit 130, for example. The pixel drive circuit 21A and the peripheral circuit 21B may be provided as a lower layer of the insulating layer 23, for example, on the drive substrate 11. Non-limiting examples of the insulating layer 21 may include a simple metal element such as aluminum (Al), copper (Cu), and titanium (Ti), or an alloy thereof.

The wiring layer 22 may constitute, for example, a gate electrode and a channel layer that may constitute the TFT. The channel layer may have an island shape, for example, and may have a channel region at a position facing a gate electrode between an unillustrated pair of source and drain electrodes. The channel layer may be configured by, for example, an oxide semiconductor made of, for example, indium, gallium, zinc, and oxygen. The channel layer may be configured by an oxide semiconductor such as IGZO.

The insulating layers 23 and 32 may function, for example, as follows. The insulating layer 23 may prevent short circuit between wiring lines constituting the transistor Tr1, for example, and the insulating layer 32 may function as an inter-pixel insulating layer (or as a partition). The insulating layers 23 and 32 may be provided on the drive substrate 11 to extend from the display region 110A to a region outside the display region 110A (e.g., to an end portion of the drive substrate 11 through the peripheral region 110B). The insulating layers 23 and 32 may be made of, for example, an organic insulating material. Specific examples of the organic insulating material may include polyimide, an acrylic resin or a novolac resin, and siloxane. The insulating layers 23 and 32 may be separated into the inner peripheral portion and the outer peripheral portion by the separating groove 41 at the peripheral region 110B. It is to be noted that the insulating layers 23 and 32 may be preferably separated completely into the inner peripheral portion and the outer peripheral portion by the separating groove 41; however, this is not limitative. For example, the insulating layer 23 and the insulating layer 32 may also be continuously provided partially, or may also remain partially at the bottom portion of the separating groove 41.

The wiring layer 31 may be configured by the lower electrode 31A and an electrically conductive film 31B. The lower electrode 31A may function as an anode (as an anode electrode), and may be provided for each of the color pixels 5 (i.e., 5R, 5G, and 5B) in the display region 110A. The electrically conductive film 31B may be cut away from the lower electrode 31A by an opening 42, and may be provided substantially uniformly at the peripheral region 110B. For example, as illustrated in FIG. 2, the electrically conductive film 31B may cover an end surface and a bottom portion of the insulating layer 23 separated by the separating groove 41. The wiring layer 31 may be made of, for example, a metal material having an optical reflectance of about 70% or higher. Non-limiting examples of the metal material may include aluminum (Al), and stacked layers of indium tin oxide (ITO) and silver (Ag).

The organic layer 33 may be provided on the insulating layer 32, and may be provided from the display region 110A to a portion immediately before the opening 42 illustrated in FIG. 2. More particularly, the organic layer 33 may have a layered structure in which a hole injection layer 33A, a hole transport layer 33B, a light emission layer 33C, an electron transport layer 33D, and an electron injection layer 33E are layered in order from the lower electrode 31A side, as illustrated in FIG. 5, for example. Among these layers, the layers other than the light emission layer 33C may be provided as necessary. The hole injection layer 33A may be provided to enhance hole injection efficiency and to prevent short circuit. The hole transport layer 33B may be provided to enhance efficiency of hole transport to the light emission layer 33C. The light emission layer 33C may cause recombination of electrons and holes through application of an electric field to emit light. The electron transport layer 33D may be provided to enhance efficiency of electron transport to the light emission layer 33C. The electron injection layer 33E may be provided to enhance electron injection efficiency. It is to be noted that a material for forming the organic layer 33 is not particularly limited as long as the material is a typical low-molecular or polymer organic material.

The upper electrode 34 may function as a cathode (as a cathode electrode), and may be provided as an electrode common to each of the pixels 5 in the display region 110A. The upper electrode 34 may be formed of a transparent electrode, and may be preferably made of a material such as ITO, indium zinc oxide (IZO), and zinc oxide (ZnO). The upper electrode 34 may be provided, for example, to expand beyond the organic layer 33, so as to cover an end surface of the organic layer 33 in the display region 110A. This makes it possible to prevent foreign matters such as moisture from entering the organic layer 33.

The protective layer 35 may be provided on the upper electrode 34, and may cover an end surface of the upper electrode 34. The protective layer 35 may be made of, for example, an inorganic material such as silicon oxide (SiOx), silicon nitride (SiNx), silicon oxynitride (SiNxOy), titanium oxide (TiOx), and aluminum oxide (AlxOy).

Figure 6:
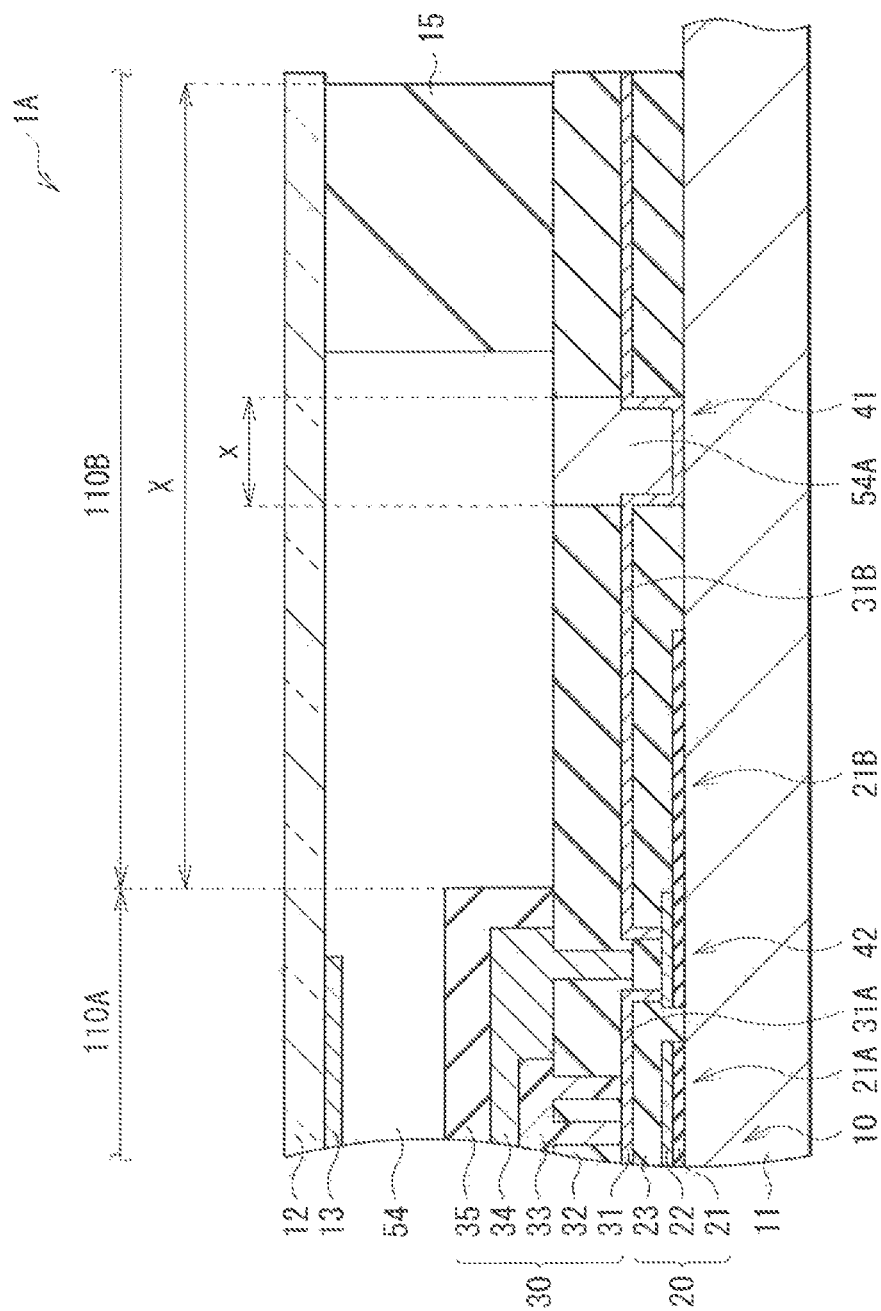
FIG. 6 is a cross-sectional view of another example of a filling layer and a separating groove of the display unit illustrated in FIG. 1.

The filling layer 14 may be provided substantially uniformly on the protective layer 35, and may function as an adhesive layer, for example. Since the filling layer 14 fills the separating groove 41 as described above, the filling layer 14 may be formed preferably using, for example, an organic material having a smaller water absorption rate than that of an organic insulating material, such as an epoxy resin and an acrylic resin, or an inorganic material having a smaller water absorption rate than that of an organic insulating material, such as aluminum oxide ($Al_2O_3$), SiOx, and SiNx. It is to be noted that the separating groove 41 does not necessarily have to be filled with the filling layer 14, and that the separating groove 41 may also be filled with a filler separately. In this case, the filling layer 14 may be formed using a sheet-like resin film. Furthermore, as illustrated in FIG. 6, a portion of a filling layer 54 may have a hollow structure. In this case, the separating groove 41 may be filled either with the above-mentioned filler or with the protective layer 35.

Figure 7:
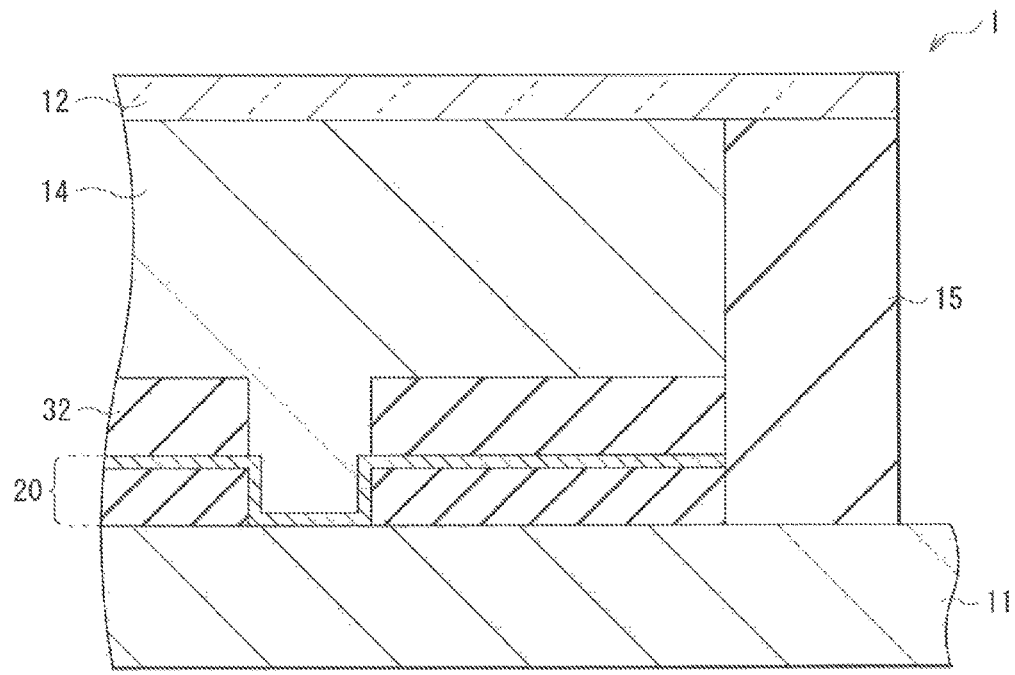
FIG. 7 is a cross-sectional view of another example of a sealing section of the display unit illustrated in FIG. 1.
Figure 8:
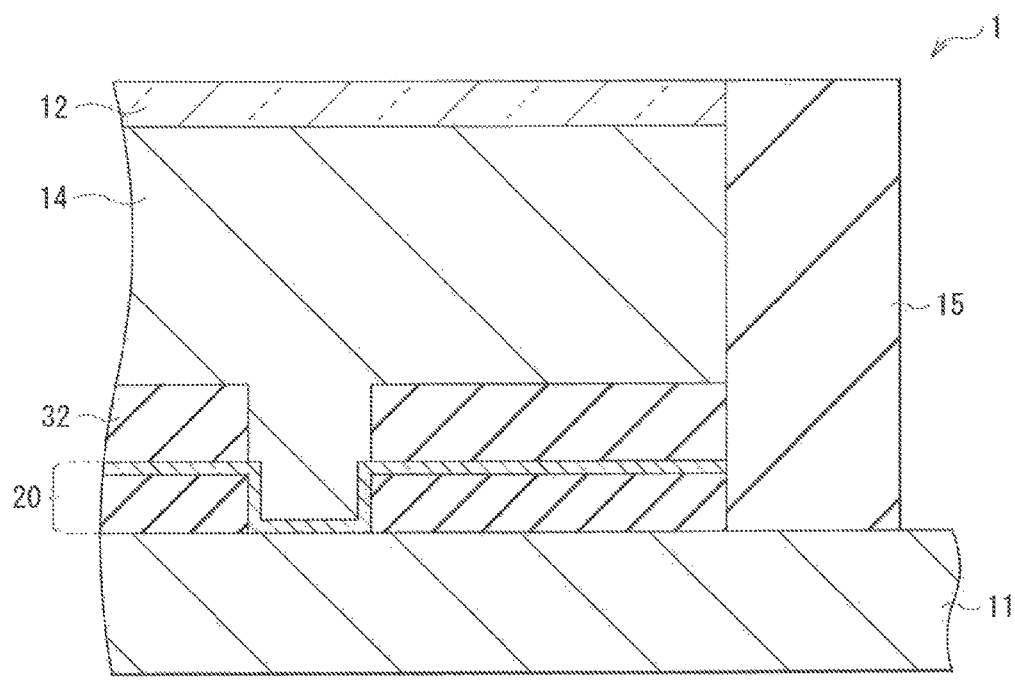
FIG. 8 is a cross-sectional view of yet another example of the sealing section of the display unit illustrated in FIG. 1.

The sealing section 15 may seal, between the drive substrate 11 and the counter substrate 12, a pixel structure such as the white organic EL device 10W provided in the display region 110A. In this example, the sealing section 15 may be provided on the insulating layer 32. The sealing section 15 may be made of, for example, an epoxy resin or an acrylic resin. A getter agent that adsorbs, for example, moisture or carbon dioxide ($CO_2$) may be added to the sealing section 15. As illustrated in FIGS. 7 and 8, for example, the sealing section 15 may be so provided between the drive substrate 11 and the counter substrate 12 as to be coplanar with end surfaces of the insulating layers 23 and 32 as illustrated in FIG. 7. Alternatively, the sealing section 15 may also be provided along end surfaces of the insulating layers 23 and 32 and of the counter substrate 12 as illustrated in FIG. 8.

The counter substrate 12 may seal the white organic EL device 10W together with the filling layer 14 and the sealing section 15. The counter substrate 12 may be made of a material such as glass transparent to each of color light beams emitted from the red pixel 5R, the green pixel 5G, and the blue pixel 5B. The CF layer 13 may be provided on a surface of the counter substrate 12 on the drive substrate 11 side. The CF layer 13 may be provided, for example, with a color filter 13A configured by, for example, a red filter, a green filter, and a blue filter at each of positions corresponding to the respective pixels 5. A black matrix 13B may be provided between the pixels 5 of the color filter 13A. Thus, white light emitted from the respective white organic EL devices 10W in the red pixel 5R, the green pixel 5G, and the blue pixel 5B may be transmitted through the above-described color filter of each color, thus allowing red light, green light, and blue light to be emitted, respectively. Further, the CF layer 13 may absorb outside light reflected in the red pixel 5R, the green pixel 5G, and the blue pixel 5B, and in the wiring line between the pixels 5 to improve a contrast.

The display unit 1 may be manufactured, for example, as follows.

The insulating layer 21 (pixel drive circuit 21A (140) and peripheral circuit 21B) may be first provided on the drive substrate 11 made of any of the above-described materials. Thereafter, the wiring layer 22 may be provided on the insulating layer 21, following which the insulating layer 23 made of any of the above-described materials may be formed by means of, for example, a coating method (wet coating method) such as a spin coating method and a liquid droplet ejection method. Thereafter, a photolithography method, for example, may be used to remove the insulating layer 23 at a predetermined position in the peripheral region 110B, thus forming a groove (which may serve as the separating groove 41 thereafter).

Next, a metal film that may serve as the wiring layer 31 (lower electrode 31A and electrically conductive film 31B) may be formed by means of, for example, a sputtering method. The wiring layer 31 may be made of any of the above-described materials. Thereafter, the formed metal film may be patterned into a desired shape by means of, for example, the photolithography method to form the wiring layer 31. More specifically, as illustrated in FIG. 1, the wiring layer 31 may be cut (the opening 42 may be formed) near the boundary between the display region 110A and the peripheral region 110B to allow a portion between the regions 110A and 110B to be non-conductive also electrically.

Next, the insulating layer 32 made of any of the above-described materials may be formed by means of, for example, the coating method (wet coating method) such as the spin coating method and the liquid droplet ejection method on the lower electrode 31A, the electrically conductive film 31B, and the insulating layer 23. Thereafter, the photolithography method, for example, may be used to remove the insulating layer 23 at a position corresponding to the groove (separating groove 41) provided in the insulating layer 23, thus forming the separating groove 41. Thereafter, the respective layers of the organic layer 33 made of any of the above-described materials may be formed by means of, for example, a vapor deposition method on the insulating layer 32 using an area mask that covers the display region 110A.

Next, the upper electrode 34 made of any of the above-described materials may be formed by means of, for example, the sputtering method on the organic layer 33 and the electrically conductive film 31B. Thereafter, the protective layer 35 made of any of the above-described materials may be formed by means of methods such as a plasma chemical vapor deposition (CVD) method, a physical vapor deposition (PVD) method, an atomic layer deposition (ALD) method, and the vapor deposition method on the upper electrode 34.

Thereafter, the color filter and the black matrix are each applied onto the counter substrate 12 made of any of the above-described materials by means of, for example, the spin coating method, and thereafter the photolithography method may be used to perform patterning, thus forming the CF layer 13. Finally, the filling layer 14 and the sealing section 15 that are made of any of the above-described materials may be each formed on the drive substrate 11. Thereafter, the counter substrate 12 may be adhered to the filling layer 14 and the sealing section 15 that are interposed between the drive substrate 11 and the counter substrate 12. Through the above-described procedures, the display unit 1 illustrated in FIG. 2 or other drawings may be completed.

1-2. Functions and Effects

In the display unit 1, a scanning signal may be supplied to each of the pixels 5 from the scanning line drive circuit 130 through the gate electrode of the write transistor Tr2, and an image signal may be supplied to and held in the holding capacitor Cs from the signal line drive circuit 120 through the write transistor Tr2. In other words, the drive transistor Tr1 may be controlled to be ON/OFF in response to the signal held in the holding capacitor Cs. This may allow a drive current Id to be injected into the white organic EL device 10W, which causes recombination of holes and electrons to emit light. The light may be transmitted through the upper electrode 34, the protective layer 35, the filling layer 14, the color filter of each color (not illustrated), and the counter substrate 12 to be extracted, owning to the display unit 1 which is the top emission display unit in this example. In this manner, the display unit 1 may perform image display (color image display).

In the display unit including the organic EL device as a display device, the entry of foreign matters such as moisture may cause deterioration of the organic EL device. A pixel including the deteriorated organic EL device may be brought into a non-emission state, which causes the product life to be shortened. In order to prevent, for example, the foreign matters to enter the organic layer, it may be contemplated to increase the distance from the outer end of the display panel to the display region. This, however, results in a wider peripheral region, which causes mass production efficiency to be lowered. Further, a wider bezel portion (bezel region) of the display unit may cause the design of the display unit to be lowered.

Figure 9:
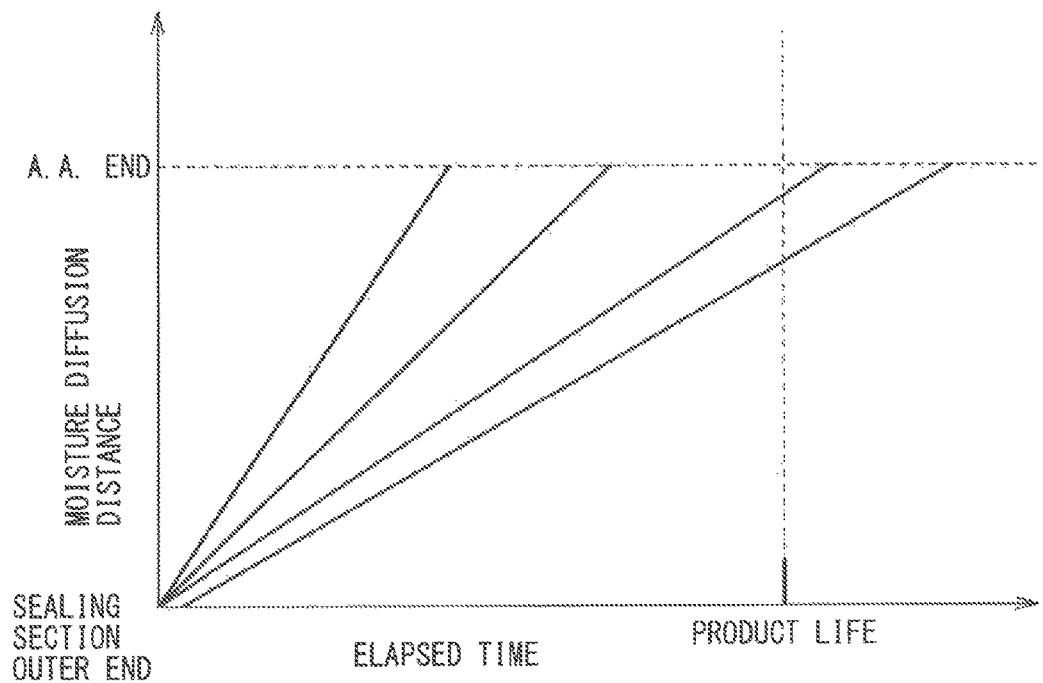
FIG. 9 is a characteristic diagram illustrating a time for moisture to reach a display region end in an any position of the display unit according to a comparative example.

To address this, as described above, a method has been developed, in which the separating groove is provided, around the display region. The separating groove separates the insulating layer, which may be an entry path of foreign matters such as moisture, into the inner peripheral portion and the outer peripheral portion, to thereby prevent the entry of the foreign matters such as moisture while narrowing the bezel region. However, effects obtained thereby has been insufficient. FIG. 9 indicates a time (an elapsed time) in which moisture reaches the outer end (Active Area; A.A.) of the display region at any four points of such a display unit (e.g., at respective sides of a rectangular display unit). In other words, FIG. 9 indicates a time (an elapsed time) in which shrinkage of a light emission region (peripheral shrink) occurs due to the entry of moisture from the periphery. As seen from FIG. 9, the time in which the moisture reaches the outer end of the display region differs for each side; at a certain side, the peripheral shrink occurs before the product life, which causes the life of the display unit to be shortened.

This is because a position for forming a seal (corresponding to the sealing section 15 in the present embodiment) that seals the pixel structure at the peripheral region differs for each side. The peripheral region is provided with, in addition to the peripheral circuit, a mounting region on which a circuit substrate is mounted at a certain side. On the circuit substrate, for example, terminals that supply an external signal to an IC chip and the pixel drive circuit are formed to be arranged. In this manner, the distance from the outer end of the seal provided in the peripheral region to the display region differs for each side. Therefore, simply providing only the separating groove having a constant width on the periphery of the display region causes variance in the time in which the peripheral shrink occurs at each side, as described above. As a method for suppressing the variance by extending the time in which the peripheral shrink occurs, it may be contemplated to increase the width of the peripheral region depending on a member to be disposed at the peripheral region. However, this results in a wider bezel region, which causes the design of the display unit to be lowered.

Figure 10:
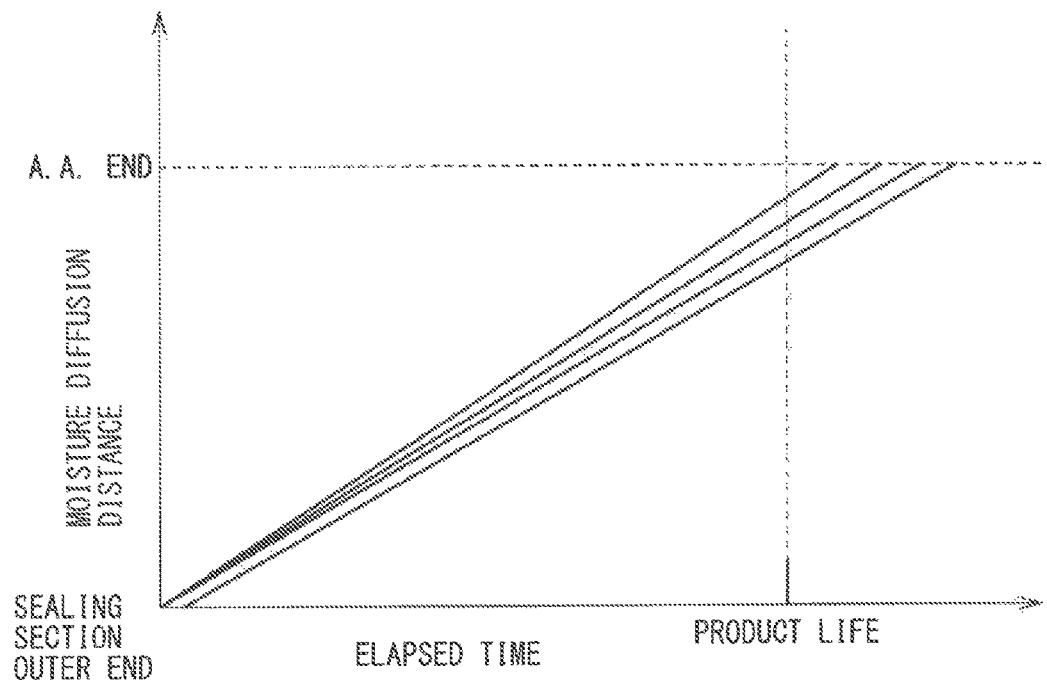
FIG. 10 is a characteristic diagram illustrating a time for moisture to reach a display region end in an any position of the display unit illustrated in FIG. 1.

In contrast, the display unit 1 according to the present embodiment has the separating groove 41 that may have different widths depending on the distance from the outer end of the sealing section 15 to the outer end of the display region 110A. More specifically, the separating groove 41 is provided to be narrower when the distance from the outer end of the sealing section to the outer end of the display region is larger, and to be wider when the distance is smaller. FIG. 10 indicates a time (an elapsed time) in which moisture reaches the outer end of the display region 110A at any four points of the display unit 1 (e.g., at respective sides of the rectangular display unit 1). As seen from FIG. 10, the time in which the peripheral shrink occurs is substantially the same for each side. Further, the time at which the peripheral shrink occurs comes after the end of the product life that is attributed to a usage environment. In other words, foreign matters are prevented from entering the display region from the outside without increasing the distance from the outer end of the sealing section to the outer end of the display region 110A.

As described above, in the present embodiment, the separating groove 41 that separates each of the insulating layers 23 and 32 into the inner peripheral portion and the outer peripheral portion has a width that is narrower when the distance from the outer end of the sealing section 15 to the outer end of the display region 110A is larger, and is wider when the distance is smaller. This makes it possible to prevent foreign matters from entering the display region 110A from the outside without increasing the width of the peripheral region 110B, i.e., without increasing the distance from the outer end of the sealing section 15 to the outer end of the display region 110A. Therefore, it becomes possible to enhance reliability of the display unit 1 and an electronic apparatus including the display unit 1 while achieving a narrower bezel.

Further, it becomes possible to narrow the bezel region, i.e., to narrow the peripheral region 110B, thus enhancing mass production efficiency of the display panel 110.

Furthermore, the separating groove 41 may be preferably filled with a material having a lower water permeability than that of the material that forms the insulating layers 23 and 32. As described above, by filling the separating groove 41 with the filling layer 14, it becomes possible to prevent the entry of foreign matters such as moisture from the outside without increasing a manufacturing step.

In the display unit and the electronic apparatus according to an embodiment of the disclosure, the width of the separating groove may be narrower as the distance from the outer end of the sealing section that seals the display region to the outer end of the display region is larger, and may be wider as the distance is smaller. The separating groove may separate the insulating layer, which may extend from the display region to the peripheral region, into the inner peripheral portion and the outer peripheral portion. This makes it possible to prevent foreign matters from entering the display region from the outside without increasing the distance from the outer end of the sealing section to the outer end of the display region.

According to the display unit and the electronic apparatus according to an embodiment of the disclosure, the insulating layer, which may extend from the display region to the peripheral region, may be provided with the separating groove. The separating groove has a width that is adjusted depending on the distance from the outer end of the sealing section to the outer end of the display region. In other words, the width of the separating groove may be narrower as the distance from the outer end of the sealing section to the outer end of the display region is larger, and may be wider as the distance is smaller. This makes it possible to prevent foreign matters such as moisture from entering the display region from the outside without increasing the distance from the outer end of the sealing section to the outer end of the display region. That is, it becomes possible to improve reliability of the display unit and of the electronic apparatus including the display unit while achieving a narrower bezel. It is to be noted that the effects described herein are not necessarily limitative, any of the effects described in the disclosure may be provided.

Next, description is given of a second embodiment. It is to be noted that the same reference numerals are assigned to the same components as those in the first embodiment, and description thereof will be omitted as appropriate.

2. Second Embodiment

Figure 11:
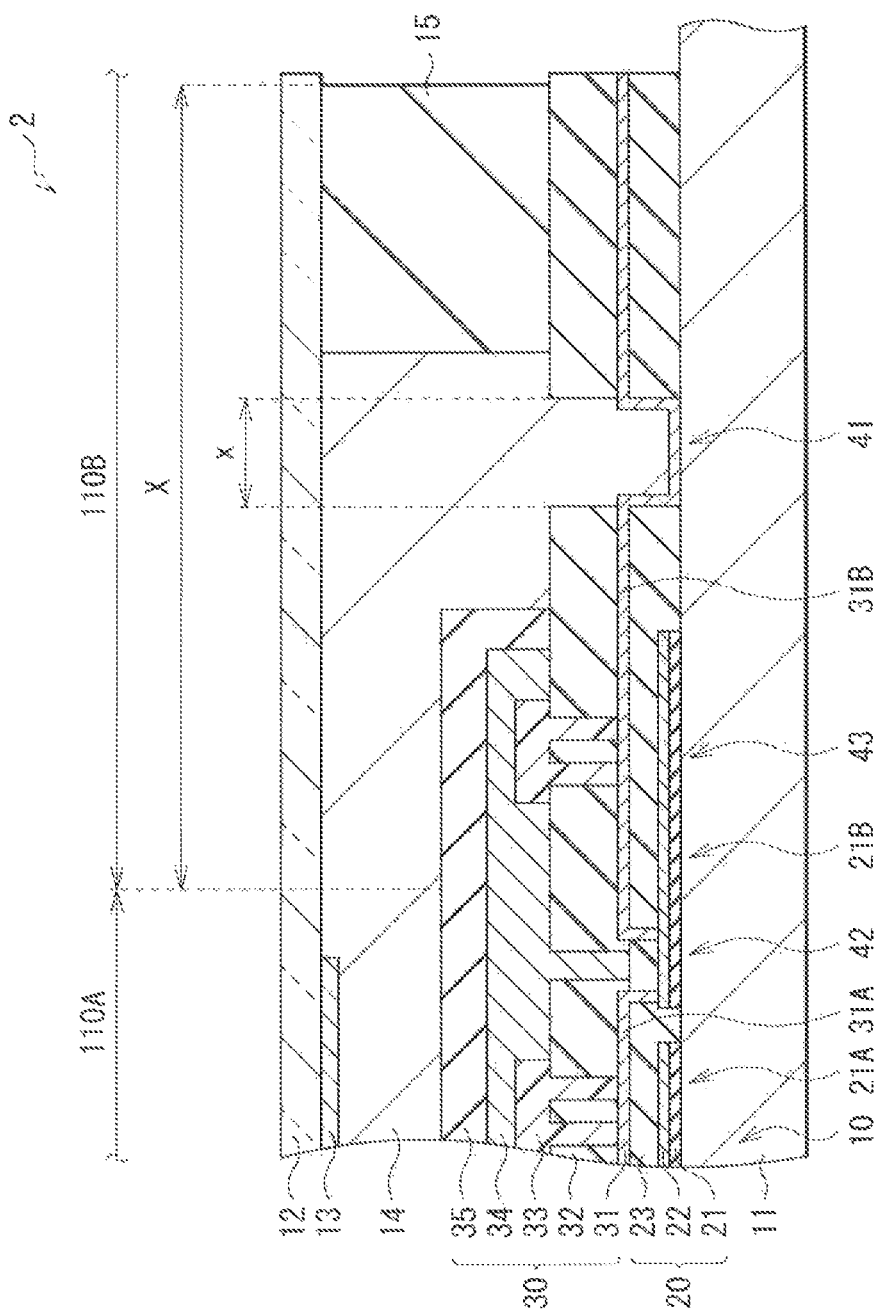
FIG. 11 is cross-sectional view of a display unit according to a second embodiment of the disclosure.

FIG. 11 illustrates a cross-sectional configuration of a display unit (a display unit 2) according to a second embodiment of the disclosure. The display unit 2 may be used as an organic EL television or other apparatuses similarly to the display unit 1. The display region 110A and the peripheral region 110B around the display region 110A may be provided as the display panel 110 on the drive substrate 11. The display unit 1 may be a top surface light-emitting display unit (so-called top emission display unit) that emits color light beams of R (red), G (green), and B (blue) from the top surface side (a surface opposite to the drive substrate 11) by using, for example, the white organic EL device 10W and the color filter 13A described later. The display unit 2 according to the present embodiment is provided with a shielding structure (e.g., a dummy structure 43) that is formed between the display region 110A and the peripheral region 110B and prevents entry of foreign matters such as moisture from the outside.

The shielding structure may be provided around the display region 110A, and more specifically may be provided between the separating groove 41 and the display region 110A. The separating groove 41 may separate the insulating layer 23 from the insulating layer 32. The shielding structure may be similar to, for example, the pixel structure provided in each of the pixels 5R, 5G, and 5B. The shielding structure (pixel structure) may not be used for actual display, and may be so-called dummy structure 43. In the present embodiment, the pixel structure (or a dummy pixel) may be provided; however, this is not limitative. The wiring line may also be provided as the shielding structure (or as dummy wiring line). It is to be noted that, when the dummy wiring line is provided as the shielding structure, the dummy wiring line may be preferably provided to have as wide range as possible between the separating groove 41 and the display region 110A. Further, the shape of the dummy wiring line may be preferably a shape, such as a pattern having a cross with the arms bent at right angles, that makes it possible to trap foreign matters such as moisture having entered from the outside.

Figure 12:
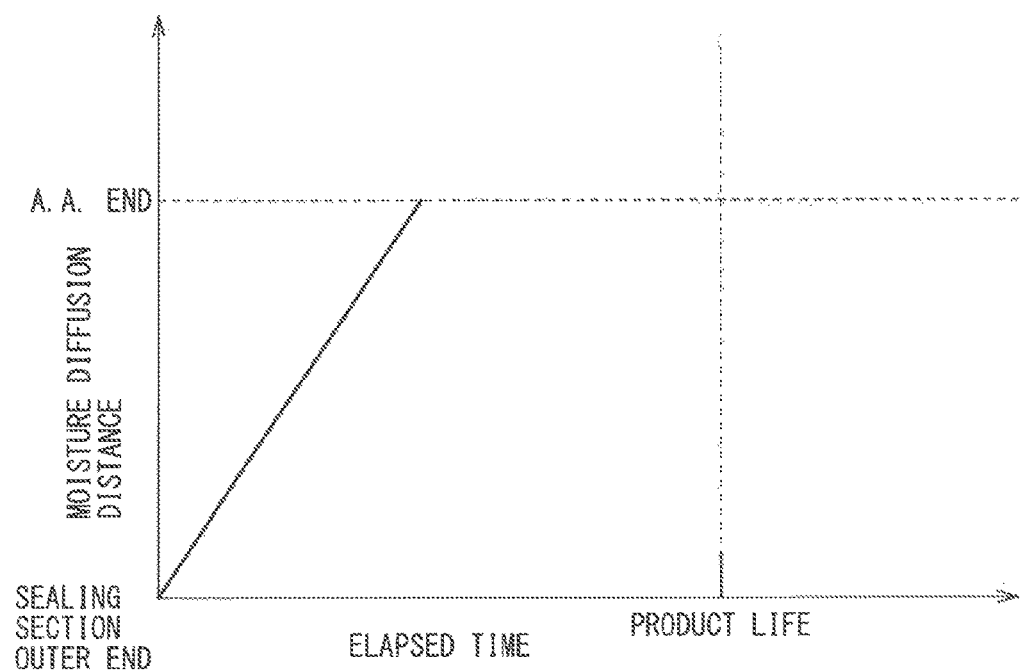
FIG. 12 is a characteristic diagram illustrating a time for moisture to reach a display region end in an any position of a display unit according to a comparative example.
Figure 13:
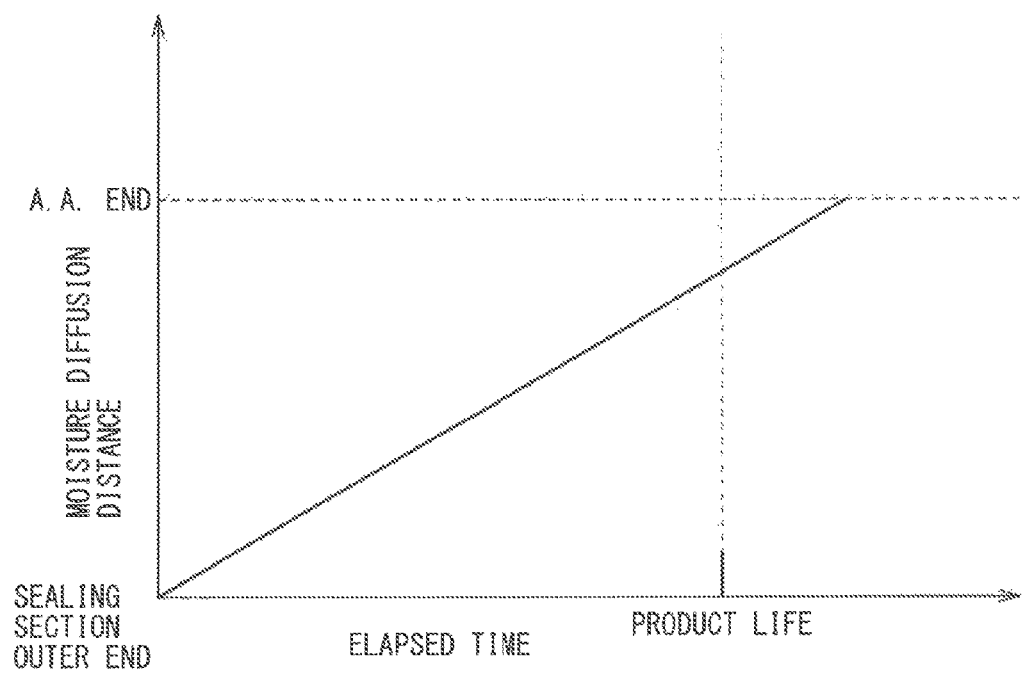
FIG. 13 is a characteristic diagram illustrating a time for moisture to reach a display region end in an any position of the display unit illustrated in FIG. 11.

FIG. 12 indicates a time (an elapsed time) in which moisture reaches the outer end of the display region in an any position when the dummy structure 43 is not provided. FIG. 13 indicates a time in which moisture reaches the outer end of the display region when the dummy structure 43 is provided around the display region 110A. Thus, providing the dummy structure 43 around the display region 110A makes it possible to delay the time at which the peripheral shrink occurs.

As described above, in the present embodiment, the dummy structure 43 is provided between the display region 110A and the peripheral region 110B, more specifically between the display region 110A and the separating groove 41. This makes it possible to further prevent the entry of foreign matters such as moisture from the outside without increasing a manufacturing step. Therefore, it becomes possible to further enhance reliability of the display unit 2 and an electronic apparatus including the display unit 2 while achieving a narrower bezel.

3. Application Example

A description is given below of an application example of the display units (display units 1 and 2) described above in the first and second embodiments. An display unit according to any of the above-described embodiments is applicable to a display device in an electronic apparatus in various fields that displays, as an image or a picture, an image signal supplied from outside or an image signal generated inside the electronic apparatus. Examples of the electronic apparatus may include a television, a digital camera, a laptop personal computer, a portable terminal apparatus such as a mobile phone, and a video camera. The display unit is particularly suitable for a small- and mid-sized displays for mobile use. The followings are examples of the small- and mid-sized displays.

Application Example 1

Figure 14A:
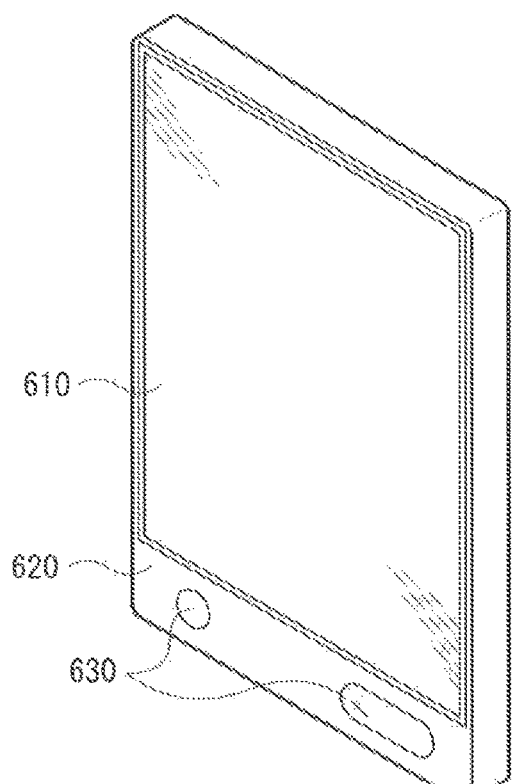
FIG. 14A is a perspective view of an outer appearance of Application Example 1 such as the display unit illustrated in FIG. 1, as viewed from the front.
Figure 14B:
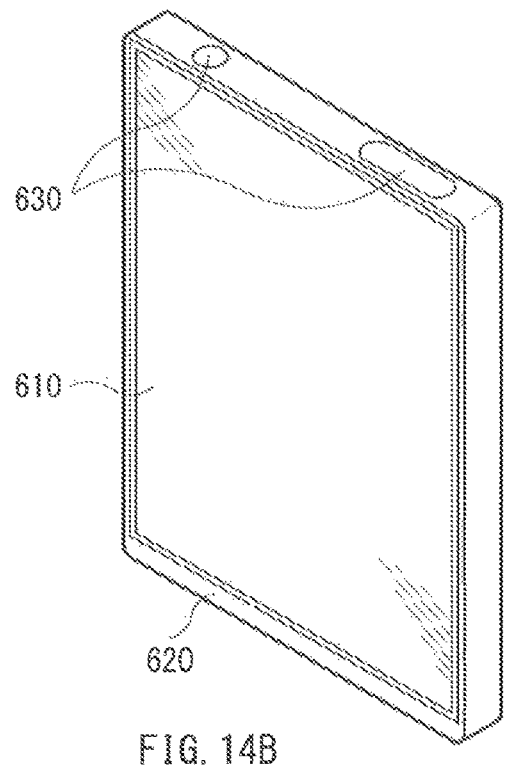
FIG. 14B is a perspective view of an outer appearance of Application Example 1 as viewed from the rear.

FIGS. 14A and 14B illustrate an outer appearance of a tablet personal computer according to Application Example 1. The tablet personal computer may have a casing 620 on which a touch panel section 610 and an operational section 620 may be disposed, for example. Any of the display units 1 and 2 according to the above-described embodiments may be mounted on the touch panel section 610.

Application Example 2

Figure 15:
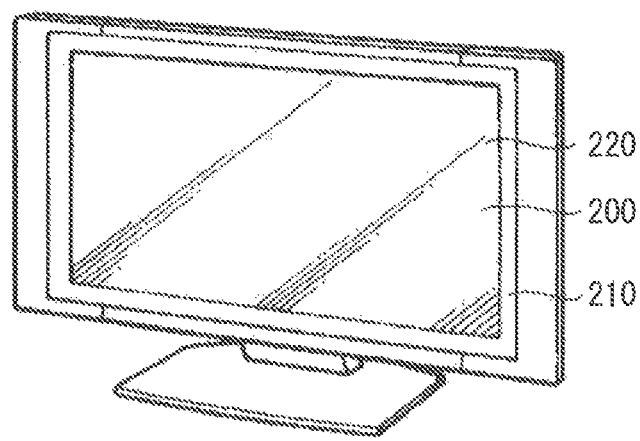
FIG. 15 is a perspective view of an outer appearance of Application Example 2.

FIG. 15 illustrates an outer appearance of a television according to Application Example 2. The television may have an image display screen section 200 including a front panel 210 and a filter glass 220, for example. The image display screen section 200 may correspond to any of the display units 1 and 2 according to the above-described embodiments.

Application Example 3

Figure 16:
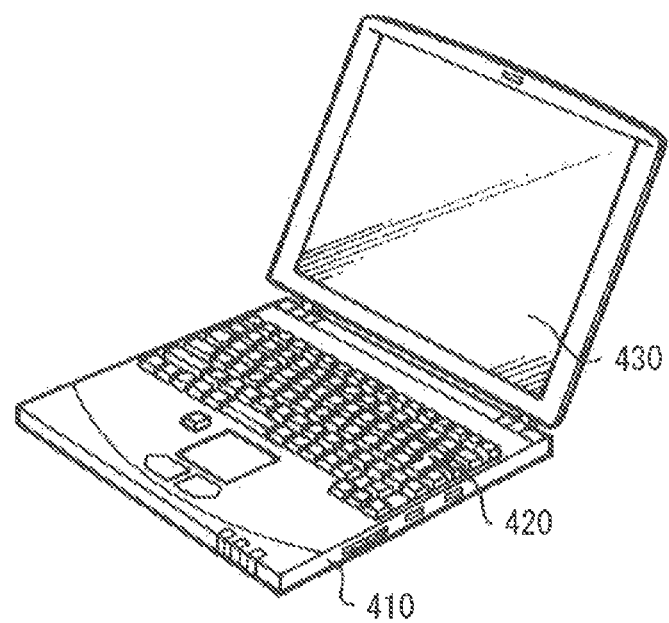
FIG. 16 is a perspective view of an outer appearance of Application Example 3.

FIG. 16 illustrates an outer appearance of a laptop personal computer according to Application Example 3. The laptop personal computer may have, for example, a main body 410, a keyboard 420 for input operation of letters, etc., and a display section 430 that displays an image. The display section 430 may be configured by any of the display units 1 and 2 according to the above-described embodiments.

The present disclosure has been described hereinabove referring to the first and second embodiments and the application examples. However, the disclosure is not limited to the first and second embodiments and the application examples, and may be variously modified.

For example, the material, the thickness, the film formation method and the film formation condition of each layer described in the first and second embodiments and the application examples are not limitative; any other material and any other thickness may also be employed, and any other film formation method and any other film formation condition may also be employed.

Moreover, in the first and second embodiments, the description has been given of the display device that is the top surface light-emitting display unit (top emission display unit); however, this is not limitative. The display unit may also be configured to be a bottom surface light-emitting display unit (bottom emission display unit), for example. In the case of the bottom surface light-emitting display unit, for example, the lower electrode 31A may be made of any of ITO, IZO and ZnO. The upper electrode 34 may be made of Al or MgAg, or the layered structure of ITO, Ag, and ITO, for example. The bottom surface light-emitting display unit may be formed with a layering order in which the organic layers 33 are layered reversely to the first and second embodiments. In this case, the color filter 13A may be provided between the insulating layer 23 and a layer in which the TFT (Tr1) or other components are formed. In a combustible light-emitting display unit, light emitted from the light-emitting layer inside the organic layer 33 may be transmitted through the lower electrode and the drive substrate 11 to be extracted to the outside. The combustible light-emitting display unit may also have a so-called microcavity (microresonator) structure. The microresonator structure may be, for example, a structure in which a plurality of layers having a predetermined refractive index difference are layered between a pair of reflective films. The microresonator structure may perform optical confinement through repetitive reflection of incident light between the pair of reflective films.

Moreover, description has been given referring specifically to the configuration of the organic EL device in the first and second embodiments. However, all layers are not necessarily included, and other layers may also be included. For example, in the first and second embodiments and the application examples, the organic layer 33 of the organic EL device (white organic EL device 10W) is configured to have the layered structure. In this layered structure, the hole injection layer 33A, the hole transport layer 33B, the light-emitting layer 33C, the electron transport layer 33D, and the electron injection layer 33E are layered in order from the lower electrode 31A side; however, this is not limitative. For example, a so-called stack structure may also be employed.

Moreover, it is also possible to remove the insulating layer 23 provided on the peripheral region 110B side, among the insulating layers 23 separated by the separating groove 41.

In addition, description has been given of the active matrix display unit in the first and second embodiments; however, the present disclosure may also be applied to a passive matrix display unit. Further, the configuration of the pixel drive circuit that performs an active matrix drive is not limited to those described in the first and second embodiments; a capacitor or a transistor may also be added as necessary. In this case, a necessary drive circuit may also be added, in addition to the signal line drive circuit 120 and the scanning line drive circuit 130, depending on alteration of the pixel drive circuit.

Description has been given of three types of pixels of the red pixel 5R, the green pixel 5G, and the blue pixel 5B as color pixels in the first and second embodiments and the application examples. However, this is not limitative; for example, the color pixel such as a white pixel 5W and a yellow pixel 5Y may also be combined.

It is to be noted that the effects described herein are mere examples. The effect of the technology is not limited thereto, and may include other effects.

It is to be noted that the technology may also have the following configurations.

[1]

A display unit including:

a display region in which a plurality of pixels are disposed;

a peripheral region provided on outer edge side of the display region; an insulating layer extending from the display region to the peripheral region;

a separating groove that is provided in the peripheral region and separates the insulating layer into an inner peripheral portion and an outer peripheral portion; and a sealing section that is provided in the outer peripheral portion of the insulating layer and seals the display region, the separating groove having a width that is narrower as a distance is larger from an outer end of the display region to an outer end of the sealing section, and is wider as the distance is smaller.

[2]

The display unit according to [1], wherein
the distance includes a plurality of distances, and
the width includes a plurality of widths that satisfy the following expression:

$$xa<xb<xc<xd$$

where
the distances in any positions are X1, X2, X3, and X4,
the widths in any positions are xa, xb, xc, and xd, and
the distances are defined as X1>X2>X3>X4.

[3]

The display unit according to [1] or [2], wherein the separating groove is filled with a filler.

[4]

The display unit according to [3], wherein the filler has a water absorption rate that is different from a water absorption rate of a material that forms the insulating layer.

[5]

The display unit according to [4], wherein the filler has the water absorption rate that is smaller than the water absorption rate of the material that forms the insulating layer.

[6]

The display unit according to any one of [1] to [5], wherein the insulating layer is made of an organic material.

[7]

The display unit according to any one of [3] to [6], wherein the filler includes an inorganic material.

[8]

The display unit according to any one of [1] to [7], further including a shielding structure provided between the display region and the separating groove.

[9]

The display unit according to [8], wherein the shielding structure includes a dummy structure.

[10]

The display unit according to [9], wherein the dummy structure includes a pixel structure.

[11]

An electronic apparatus provided with a display unit, the display unit including:

a display region in which a plurality of pixels are disposed;

a peripheral region provided on outer edge side of the display region;

an insulating layer extending from the display region to the peripheral region;

a separating groove that is provided in the peripheral region and separates the insulating layer into an inner peripheral portion and an outer peripheral portion; and a sealing section that is provided in the outer peripheral portion of the insulating layer and seals the display region, the separating groove having a width that is narrower as a distance is larger from an outer end of the display region to an outer end of the sealing section, and is wider as the distance is smaller.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "about" as used herein can allow for a degree of variability in a value or range. Moreover, no element or component in this disclosure is intended to be dedicated to the public regardless of whether the element or component is explicitly recited in the following claims.

What is claimed is:

1. A display unit comprising:
   a display region in which a plurality of pixels are disposed;
   a peripheral region provided on outer edge side of the display region;
   an insulating layer extending from the display region to the peripheral region;
   a separating groove that is provided in the peripheral region and separates the insulating layer into an inner peripheral portion and an outer peripheral portion; and
   a sealing section that is provided in the outer peripheral portion of the insulating layer and seals the display region,
   the separating groove having a width that is narrower as a distance is larger from an outer end of the display region to an outer end of the sealing section, and is wider as the distance is smaller.

2. The display unit according to claim 1, wherein
   the distance comprises a plurality of distances, and
   the width comprises a plurality of widths that satisfy the following expression:

$xa < xb < xc < xd$ where
   the distances in any positions are X1, X2, X3, and X4,
   the widths in any positions are xa, xb, xc, and xd, and
   the distances are defined as $X1 > X2 > X3 > X4$.

3. The display unit according to claim 1, wherein the separating groove is filled with a filler.

4. The display unit according to claim 3, wherein the filler has a water absorption rate that is different from a water absorption rate of a material that forms the insulating layer.

5. The display unit according to claim 4, wherein the filler has the water absorption rate that is smaller than the water absorption rate of the material that forms the insulating layer.

6. The display unit according to claim 1, wherein the insulating layer is made of an organic material.

7. The display unit according to claim 3, wherein the filler comprises an inorganic material.

8. The display unit according to claim 1, further comprising a shielding structure provided between the display region and the separating groove.

9. The display unit according to claim 8, wherein the shielding structure comprises a dummy structure.

10. The display unit according to claim 9, wherein the dummy structure comprises a pixel structure.

11. An electronic apparatus provided with a display unit, the display unit comprising:
    a display region in which a plurality of pixels are disposed;
    a peripheral region provided on outer edge side of the display region;
    an insulating layer extending from the display region to the peripheral region;
    a separating groove that is provided in the peripheral region and separates the insulating layer into an inner peripheral portion and an outer peripheral portion; and
    a sealing section that is provided in the outer peripheral portion of the insulating layer and seals the display region,
    the separating groove having a width that is narrower as a distance is larger from an outer end of the display region to an outer end of the sealing section, and is wider as the distance is smaller.

* * * * *